(12) United States Patent
Sung et al.

(10) Patent No.: US 6,344,665 B1
(45) Date of Patent: Feb. 5, 2002

(54) ELECTRODE STRUCTURE OF COMPOUND SEMICONDUCTOR DEVICE

(75) Inventors: Ying Che Sung; Weng Ming Liu, both of Taoyuan (TW)

(73) Assignee: Arima Optoelectronics Corp., Taoyuan (TW)

( * ) Notice: Subject to any disclaimer, the term of this patent is extended or adjusted under 35 U.S.C. 154(b) by 39 days.

(21) Appl. No.: 09/599,994

(22) Filed: Jun. 23, 2000

(51) Int. Cl.[7] ............................................. H01L 33/00
(52) U.S. Cl. .......................... 257/91; 257/99; 257/459; 257/744; 257/745
(58) Field of Search .............................. 257/91, 99, 95, 257/98, 448, 457, 459, 744, 745

(56) References Cited

U.S. PATENT DOCUMENTS 5,563,422 A * 10/1996 Nakamura et al. ............ 257/13
6,078,064 A * 6/2000 Ming-Jiunn et al. ........ 257/103
6,153,894 A * 11/2000 Udagawa ...................... 257/96
6,281,526 B1 * 8/2001 Nitta et al. .................... 257/99

FOREIGN PATENT DOCUMENTS

JP            10-321913         * 12/1998

* cited by examiner

Primary Examiner—Minh Loan Tran
(74) Attorney, Agent, or Firm—Rosenberg, Klein & Lee

(57) ABSTRACT

An electrode structure of compound semiconductor device. The compound semiconductor device has a substrate, an n-type layer over entire substrate, a mesa-like p-type layer on partial surface of the n-type layer, a transparent conductive layer on the mesa-like p-type layer; a p-contact formed on the transparent conductive layer and an n-contact formed on the exposed n-type layer. The n-contact comprises an enclosure portion compassing the p-contact, whereby the current flowed from the p-contact to the n-contact is uniform.

2 Claims, 5 Drawing Sheets

ELECTRODE STRUCTURE OF COMPOUND SEMICONDUCTOR DEVICE

FIELD OF THE INVENTION

The present invention relates to an electrode structure of compound semiconductor device, especially to an electrode structure of compound semiconductor device by which the current is more uniform.

BACKGROUND OF THE INVENTION

Compound semiconductor devices have versatile usages in communication and display applications etc. More particularly, GaN based III-V compound semiconductor devices attract much attention due to the feasibility of blue light source. The III-V compound semiconductor comprises GaN, InGaN, AlGaN and AlInGaN and the substrate of the III-V compound semiconductor generally uses sapphire, which is insulator. Therefore, the P contact and N contact of the III-V compound semiconductor are formed on same side of the sapphire substrate. Moreover, the P contact and N contact are connected to the p-type layer and the n-type layer through ohmic contact layer.

The U.S. Pat. No. 5,563,422 filed by Nichia had proposed a manufacturing method of GaN based III-V compound semiconductor device wherein metal film is deposited on the p-type layer and an annealing step is carried to enhance the diffusion of hole. The P contact and N contact of the III-V compound semiconductor devices are formed on opposed diagonal ends of the devices to fully utilize the space. However, the current distribution is not uniform in this electrode design and a dark region can be observed in the LED device made of the III-V compound semiconductor.

It is the object of the invention to provide an electrode structure of compound semiconductor device by which the current is more uniform.

To achieve the above object, the present invention provides an electrode structure of compound semiconductor device, wherein the n-contact comprises an enclosure portion compassing the p-contact, whereby the current flowed from the p-contact to the n-contact is uniform.

The various objects and advantages of the present invention will be more readily understood from the following detailed description when read in conjunction with the appended drawing, in which:

DETAIL DESCRIPTION OF PREFERRED EMBODIMENT

Figure 1:
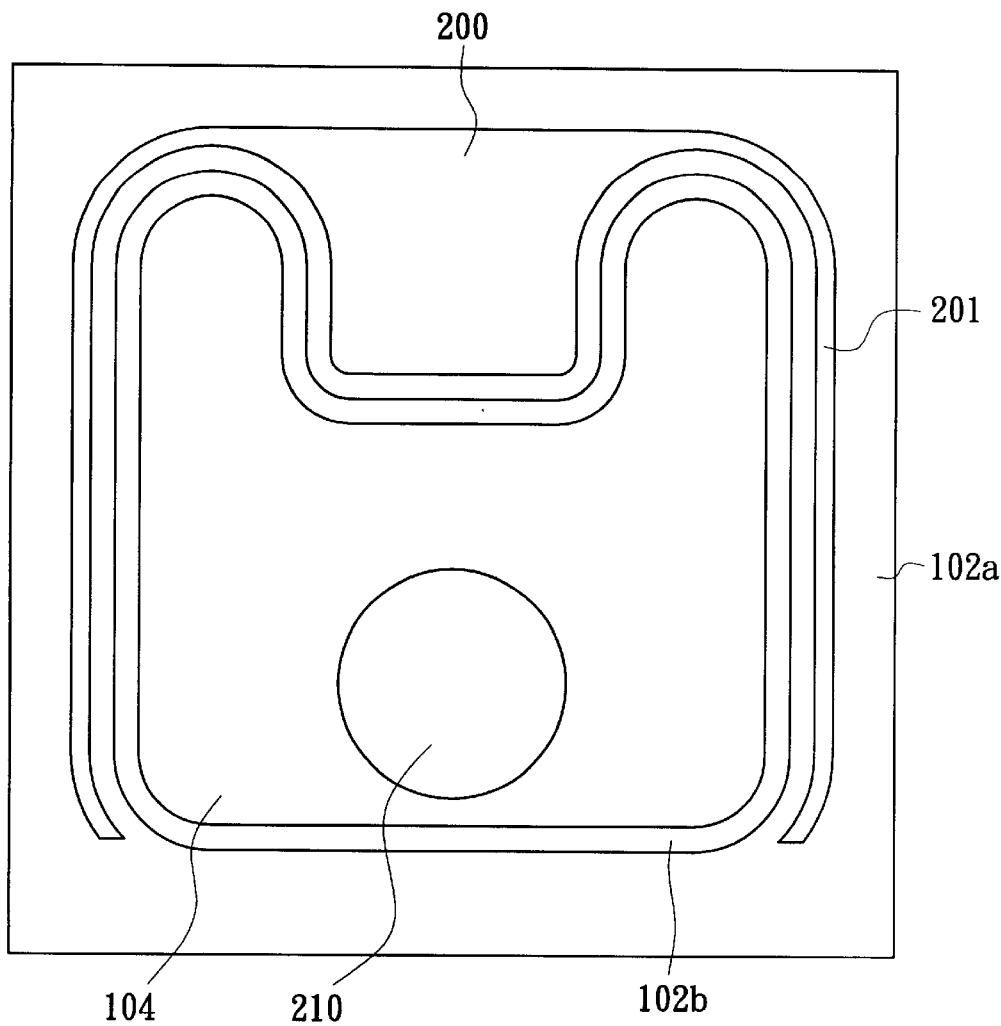
FIG. 1 is a top view of electrode structure of the present invention.
Figure 2:
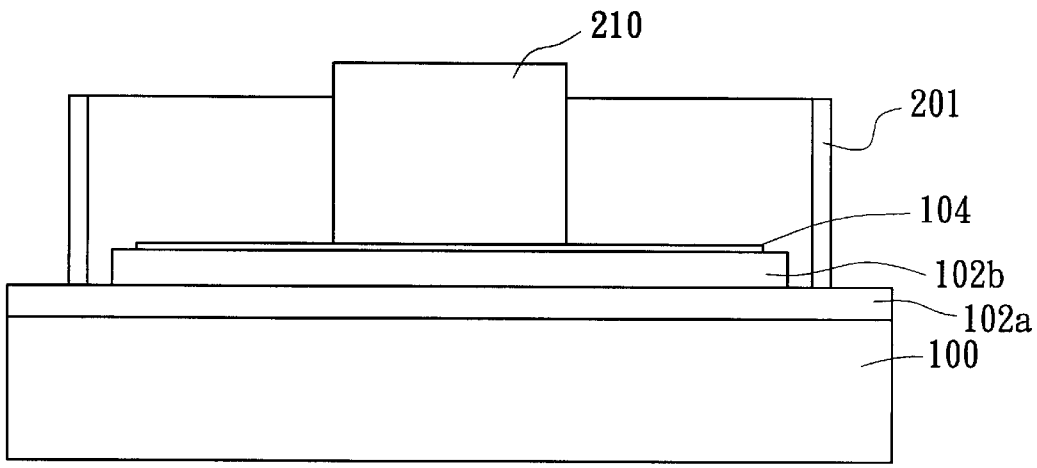
FIG. 2 is a front view of electrode structure of the present invention.

FIG. 1 is a top view of electrode structure of the present invention; and FIG. 2 is a front view of electrode structure of the present invention. The n-contact 200 comprises an enclosure portion 201 compassing the p-contact 210, whereby the current flowed from the p-contact 210 to the n-contact 200 is uniform. With reference now to FIG. 2, for a GaN LED, the substrate 100 is generally insulating sapphire, the p-contact 210 and the n-contact 200 are made on same side of the substrate 100. To isolate the p-contact 210 and the n-contact 200, the GaN semiconductor layer, after formation of pn junction, is subjected to an RIE process to from an n-type layer 102a over entire substrate 100, a mesa-like p-type layer 102b on partial surface of the n-type layer 102a. Afterward, a transparent conductive layer 104 is formed on the mesa-like p-type layer 102b. Because hole has less mobility, the p-contact 210 is formed on the transparent conductive layer 104 and the n-contact 200 is formed on the exposed n-type layer 102a. In U.S. Pat. No. 5,563,422, the P contact and N contact of the III-V compound semiconductor devices are formed on opposed diagonal ends of the devices. Therefore, the current distribution is not uniform in this electrode design and a dark region can be observed in the LED device made of the III-V compound semiconductor.

Figure 3:
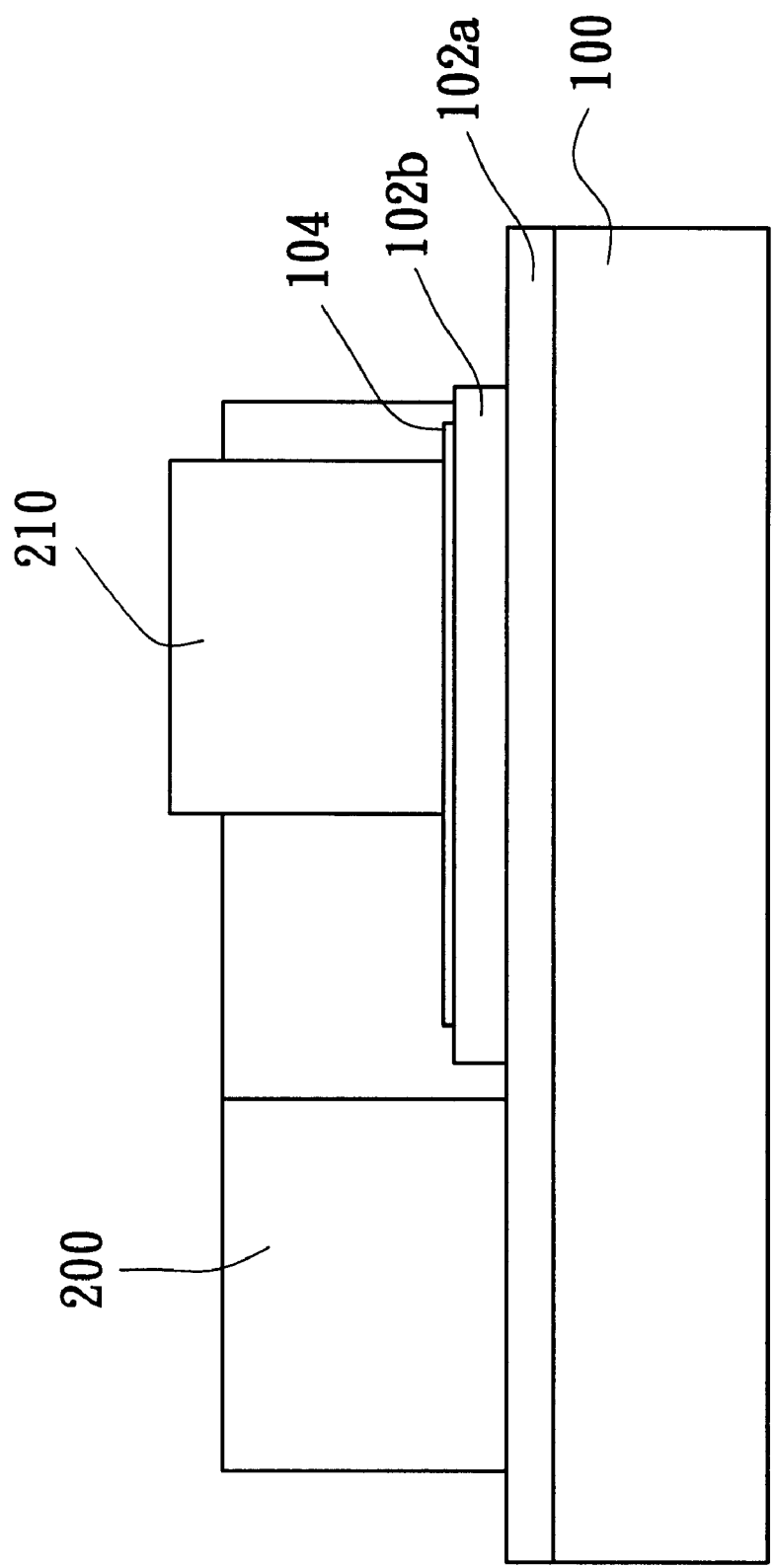
FIG. 3 is a sectional view of electrode structure of the present invention.
Figure 4:
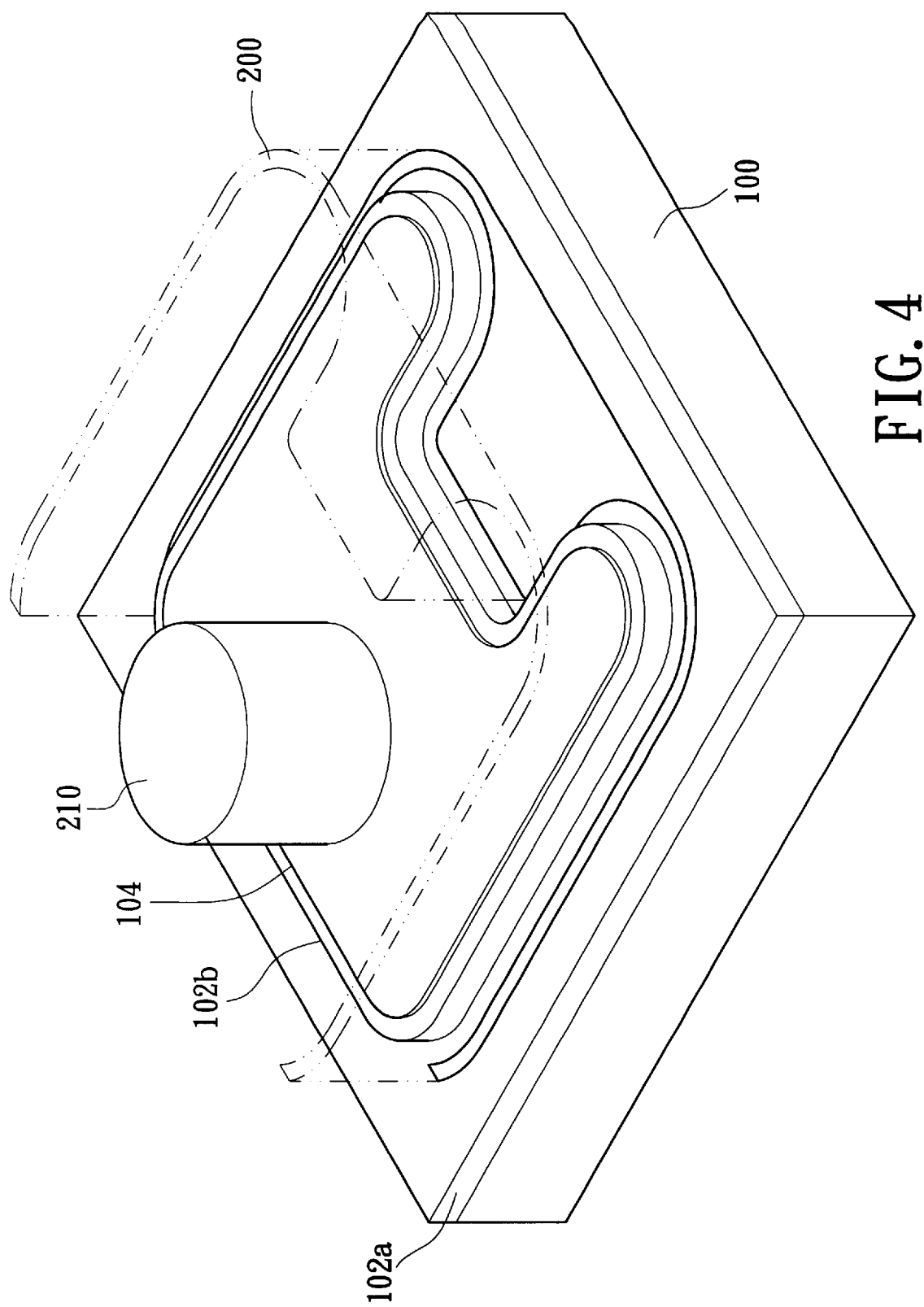
FIG. 4 is a perspective view of electrode structure of the present invention.
Figure 5:
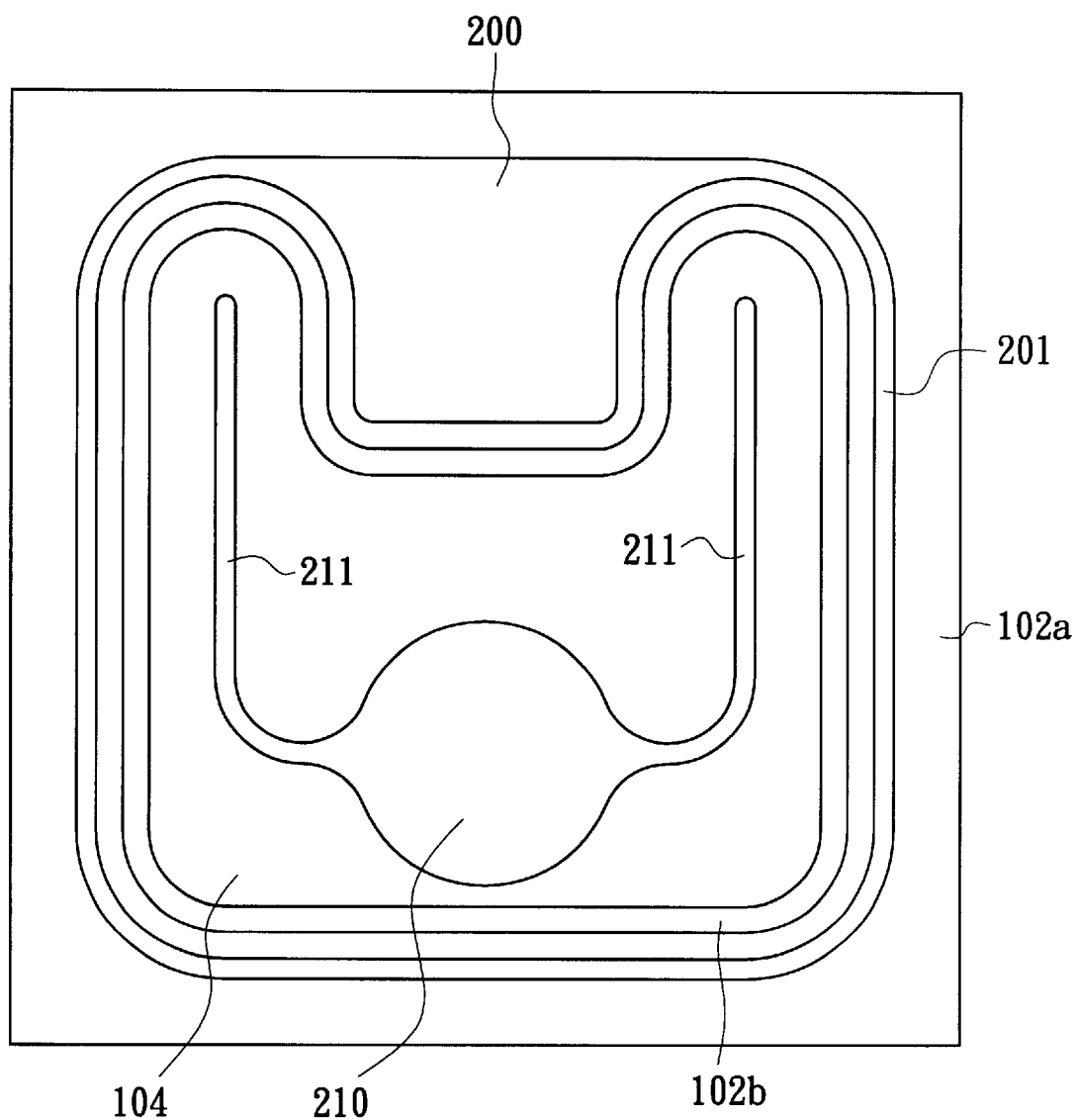
FIG. 5 is top view of another embodiment of the present invention.

With reference now to FIGS. 1, 3 and 4, the n-contact 200 comprises an enclosure portion 201 compassing the p-contact 210, whereby the current flowed from the p-contact 210 to the n-contact 200 is uniform. In those FIGS., the enclosure portion 201 is provided to encompass both sides of the p-contact 210. As shown in FIG. 5, the enclosure portion 201 is provided to encompass all sides of the p-contact 210 and the p-contact 210 has two branches 211.

Figure 6:
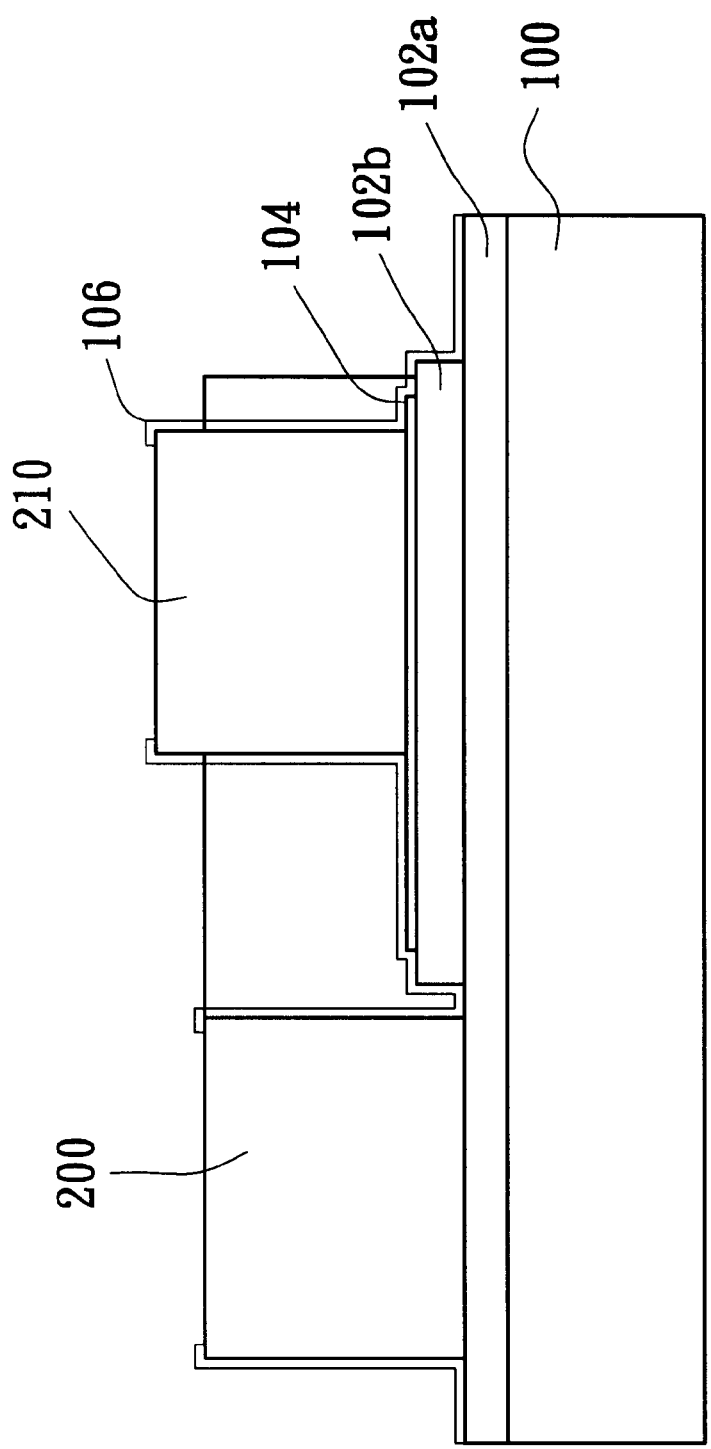
FIG. 6 is a sectional view of the electrode structure of the present invention with CVD layer.

FIG. 6 is a sectional view of the electrode structure of the present invention with CVD layer. The LED according to the present invention is deposited with a CVD layer to isolate the p-contact 210 and the n-contact 200.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

We claim:

1. An electrode structure of compound semiconductor device, the compound semiconductor device having a substrate, an n-type layer over entire substrate, a mesa-like p-type layer on partial surface of the n-type layer, a transparent conductive layer on the mesa-like p-type layer; a p-contact formed on the transparent conductive layer and an n-contact formed on the exposed n-type layer; wherein the n-contact comprises an enclosure portion compassing the p-contact, whereby the current flowed from the p-contact to the n-contact is uniform.

2. The electrode structure of compound semiconductor device as in claim 1, wherein the p-contact further comprises two branches extended from two lateral sides thereof.

* * * * *